United States Patent
Yoshiba et al.

(10) Patent No.: US 7,030,501 B2
(45) Date of Patent: Apr. 18, 2006

(54) SEMICONDUCTOR DEVICE AND SWITCHING ELEMENT

(75) Inventors: Shigeharu Yoshiba, Gunma (JP); Hirokazu Fukuda, Gunma (JP); Haruhiko Sakai, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/869,551

(22) Filed: Jun. 15, 2004

(65) Prior Publication Data

US 2005/0017339 A1 Jan. 27, 2005

(30) Foreign Application Priority Data

Jun. 19, 2003 (JP) ............................ P.2003-174464

(51) Int. Cl.
*H01L 23/52* (2006.01)
*H01L 23/48* (2006.01)
*H01L 29/40* (2006.01)

(52) U.S. Cl. .................... 257/777; 257/686; 257/401; 257/288; 257/341; 257/350; 438/108; 438/109; 361/91; 361/91.1; 361/91.5; 361/718; 361/760

(58) Field of Classification Search ................ 257/777, 257/686, E25.013, E27.099, 401, E29.263, 257/E29.027, 288, 341, 350; 438/108, 109; 361/760, 91, 91.1, 91.5, 718

See application file for complete search history.

(56) References Cited

U.S. PATENT DOCUMENTS

| 6,055,148 A | * | 4/2000 | Grover ........................ 361/103 |
| 6,184,585 B1 | * | 2/2001 | Martinez et al. ............ 257/777 |
| 6,282,107 B1 | | 8/2001 | Vinciarelli ................ 363/56.09 |
| 6,307,755 B1 | * | 10/2001 | Williams et al. ............ 361/813 |
| 6,319,755 B1 | * | 11/2001 | Mauri ........................ 438/119 |
| 6,566,760 B1 | * | 5/2003 | Kawamura et al. ......... 257/777 |
| 6,670,217 B1 | * | 12/2003 | Milla et al. ................. 438/107 |
| 6,734,568 B1 | * | 5/2004 | Matsuo et al. .............. 257/781 |
| 6,831,351 B1 | * | 12/2004 | Hirao et al. ................. 257/625 |

FOREIGN PATENT DOCUMENTS

JP 10223835 A * 8/1998

* cited by examiner

*Primary Examiner*—Tom Thomas
*Assistant Examiner*—Chris C. Chu
(74) *Attorney, Agent, or Firm*—Fish & Richardson P.C.

(57) ABSTRACT

A conventional one-chip dual MOSFET has a structure in which two chips are arranged side by side and drain electrodes are short-circuited. Therefore, the mounting area thereof is large, and the resistance between the drain electrodes cannot be reduced. Accordingly, there is a limit of reduction in size and thickness of a semiconductor device, which is demanded by the market. A dual MOSFET of the embodiment includes two semiconductor chips (MOSFET) superimposed on each other with drain electrodes thereof directly connected to each other. In the dual MOSFET, the drain electrodes do not need to be led to the outside, and only two gate terminals and two source terminals are used. Accordingly, these four terminals are led out by means of a lead frame or conductive patterns. This allows the device to be reduced in size and to have lower on-resistance.

9 Claims, 7 Drawing Sheets

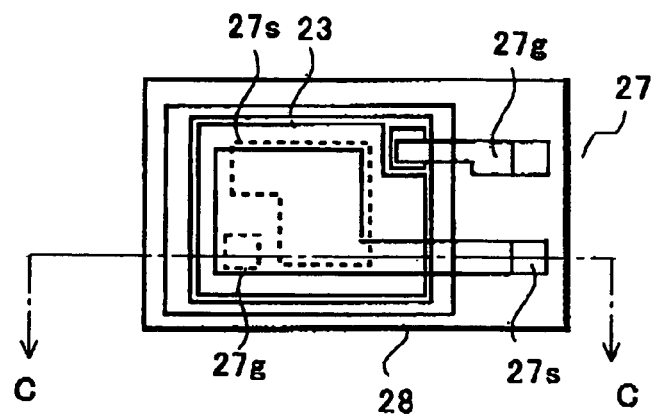
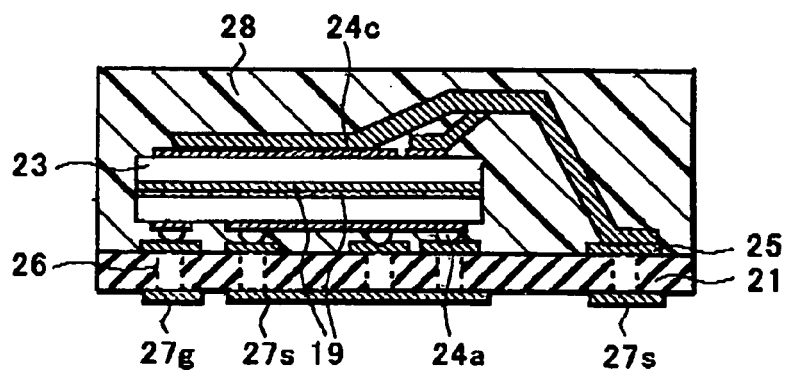
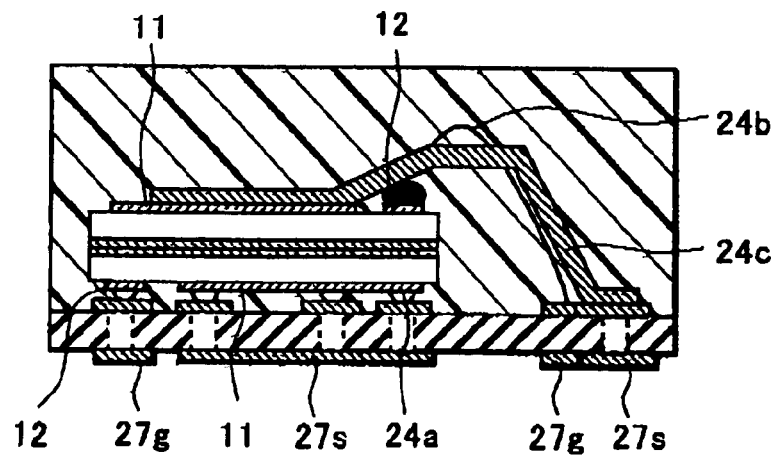

Prior Art

Prior Art

SEMICONDUCTOR DEVICE AND SWITCHING ELEMENT

BACKGROUND OF THE INVENTION

1. Field of the Invention

The present invention relates to a semiconductor device and, more particularly, to a semiconductor device realizing reduction in size of a MOSFET for battery management which can be physically included within a secondary battery.

2. Description of the Related Art

As portable terminals have become widespread, small high-capacity lithium ion batteries have been required. A protection circuit board for battery management of the charge/discharge of a lithium ion battery should be smaller and sufficiently resistant to load short circuit because of the need for weight reduction of the mobile terminals. Such a protection circuit device is required to be smaller since the protection circuit device is placed within a container of the lithium ion battery. Such a demand for a smaller protection circuit device has been fulfilled by using a Chip on Board (COB) technology which uses many chip parts. On the other hand, however, since a switching element is connected to the lithium ion battery in series, on-resistance of the switching element needs to be also reduced to an extreme degree. This is essential for increasing talk time and standby time in mobile phones.

FIG. 5 shows a specific protection circuit performing battery management. Two power MOSFETs Q1 and Q2 are connected to a lithium ion battery LiB in series. The two power MOSFETs Q1 and Q2 are on/off controlled while the voltage of the lithium ion battery LiB is detected by a control IC so that the lithium ion battery LiB is protected from over-charge, over-discharge, and load short circuit. In the two power MOSFETs Q1 and Q2, drain electrodes D are connected in common, and source electrodes S are located in both ends of the power MOSFETs Q1 and Q2. Gate electrodes G thereof are individually connected to the control IC.

In each of these power MOSFETs Q1 and Q2, a bidirectional zener diode for protection is connected between the gate and source electrodes in order to protect a thin gate oxidation film from electrostatic discharge damage.

In charging, both ends of the lithium ion battery LiB are connected to a power supply, and charge current is supplied to the lithium ion battery LiB in a solid-arrow direction in the drawing for charging. When the lithium ion battery LiB is over-charged, the control IC detects the voltage of the lithium ion battery LiB and changes the gate voltage of the power MOSFET Q2 from H (High level) to L (Low level). The power MOSFET Q2 is thereby turned off and breaks the circuit to protect the lithium ion battery LiB.

In discharging, both ends of the lithium ion battery LiB are connected to a load, and the lithium ion battery LiB drives a mobile terminal until the voltage of the lithium ion battery LiB falls to a predetermined voltage. When the lithium ion battery LiB is over-discharged, the control IC detects the voltage of the lithium ion battery LiB and changes the gate voltage of the power MOSFET Q1 from H to L. The power MOSFET Q1 is thereby turned off and breaks the circuit to protect the lithium ion battery LiB.

Furthermore, when a load short circuit occurs or when an overcurrent flows, a large current flows through the power MOSFETs Q1 and Q2, and voltage between both ends of the power MOSFETs Q1 and Q2 rapidly increases. Therefore, the control IC detects this voltage and, similarly to the case of discharging, turns off the power MOSFET Q1 to break the circuit, thus protecting the lithium ion battery LiB. However, a large current flows during a short period of time before the protection circuit works. Therefore, the peak drain currents of the power MOSFETs Q1 and Q2 are required to be large.

For such battery management, there is an increasing demand for a so-called one-chip dual MOSFET in which two MOSFETs are integrated into a single chip with drain electrodes of both the MOSFETs shared.

FIG. 6 shows an example of a conventional one-chip dual MOSFET. A one-chip dual MOSFET 33, obtained by integrating two power MOSFETs 33a and 33b into a single chip, includes source electrodes 41 and gate pad electrodes 42 on a surface thereof. In an entire back surface thereof, metal is deposited to serve as a common drain electrode (not shown) shared by the two power MOSFETs 33a and 33b. The power MOSFETs 33a and 33b are symmetrically arranged with respect to a center line X—X of the chip. The gate pad electrodes 42 of the power MOSFETS 33a and 33b are independently arranged in corners of the chip. A large number of MOSFET cells are arranged under the source electrodes 41.

FIGS. 7A and 7B show the aforementioned power MOSFET mounted on a lead frame. FIG. 7A is a top view, and FIG. 7B is a sectional view taken along a line D—D in FIG. 7A.

A lead frame 37 is a stamped frame made of copper. The power MOSFET 33 is fixed on a header 37h of the lead frame 37 with a preform material made of solder or Ag paste. The drain electrode is formed of a gold backing electrode (not shown) on a lower surface of the power MOSFET 33, and the gate pad electrodes 42 and the source electrodes 41 are formed on an upper surface of the power MOSFET 33 by sputtering an aluminum alloy. Further on an upper side of this power MOSFET 33, a metal multilayer film of Au or the like is deposited in order to reduce contact resistance with solder and a conductive material. The drain electrode of the MOSFET is fixed to the header 37h of the lead frame, and the header 37h is connected to drain terminals 37d. The gate electrodes are connected to gate terminals 37g through the gate pad electrodes 42 by bonding wires 34, and the source electrodes 41 are electrically connected to source terminals 37s by bonding wires 34.

The MOSFET 33 and the lead frame 37 are sealed with resin by transfer molding using a mold, and a resin layer 38 forms a package outline. The frame is mounted on a printed circuit board by solder or the like.

Note that the drain electrode is led out as the drain terminal 37d in FIGS. 7A and 7B, but in the case of the dual MOSFET employed in the protection circuit shown in FIG. 5, only four terminals, the source terminals 37s and the gate terminals 37g, of the chips are used.

In addition, the MOSFET may be mounted in a package in a flip-chip fashion, in which solder bumps 35 are provided to be individually connected to the source and gate electrodes on the surface, and the source and gate electrodes are electrically connected to external terminals 37 through the solder bumps 35 (for example, see Japanese Patent Laid Open Publication No. 2002-368219).

As described above, a MOSFET employed for protecting, for example, a lithium ion battery is a four-terminal element which includes two chips (MOSFET) with the drain electrodes thereof short-circuited and with the source and gate electrodes thereof led to the outside.

In such a case, a dual MOSFET is generally employed which is a single chip obtained by integrating two MOSFETs. However, the dual MOSFET requires twice the area of one MOSFET since the two chips are arranged side by side to form the single chip, resulting in a mounting area being increased.

Moreover, in the wire bonding type shown in FIGS. 7A and 7B, the on-resistance cannot be reduced since the resistance of the bonding wires is large. On the contrary, the flip-chip type uses solder bumps as connection means instead of the bonding wires, so the resistance of the connection means can be reduced compared to that of the wire bonding type. However, although current between both chips flows through a frame portion having a lower resistance (R1) than that of the substrate, in the wire bonding type, the current flows through the substrate in the flip-chip mounting type. Therefore, resistance R2 between the drain electrodes is disadvantageously increased. Accordingly, even this flip-chip mounting method has a limit of reduction in on-resistance.

In addition, as for the flip-chip type, there is a method of reducing the resistance between the drain electrodes by fixing a metal plate on the back surface of the chip. However, according to this method, the flip-chip dual-MOSFET requires a mounting area twice the size of a single chip, leading to a problem of little progress in size reduction.

SUMMARY OF THE INVENTION

The preferred embodiment of the present invention was accomplished in the light of the foregoing problems, and a first aspect of the preferred embodiment is a semiconductor device including two semiconductor chips, each including a surface electrode and a back electrode. The two semiconductor chips are superimposed on each other with the back electrodes thereof directly connected to each other, and the surface electrodes of both the semiconductor chips are led to the outside.

A second aspect of the preferred embodiment is a semiconductor device including: a semiconductor element including two semiconductor chips, each having a surface electrode and a back electrode, the two semiconductor chips being superimposed on each other with the back electrodes thereof directly connected to each other; external terminals connected to the surface electrodes through connection means; and a resin layer covering at least the superimposed semiconductor element.

The preferred embodiment includes that both the semiconductor chips have same patterns.

The preferred embodiment includes that both the semiconductor chips are MOSFETs with same patterns, and a four-terminal element is formed by short-circuiting drain electrodes of the MOSFETs and leading gate and source electrodes of the MOSFETs to the outside.

The preferred embodiment includes that the connection means is a thin metal wire.

The preferred embodiment includes that the connection means is a solder bump.

The preferred embodiment includes that the connection means is a metal plate.

The preferred embodiment includes that the external terminals are part of a lead frame.

The preferred embodiment includes that the external terminals are conductive patterns buried in the resin layer, and back surfaces of the conductive patterns are exposed from the resin layer.

The preferred embodiment includes that the superimposed semiconductor element is fixed on a surface of an insulating board, and the surface electrodes are connected to the external terminals on a back surface of the insulating board through through-holes formed in the insulating board.

BRIEF DESCRIPTION OF THE DRAWINGS

FIGS. 3A to 3C are, respectively, a plan view, a sectional view, and a sectional view explaining semiconductor devices according to the preferred embodiment.

DETAILED DESCRIPTION OF THE PREFERRED EMBODIMENTS

A description will be given of embodiments of the preferred embodiment with reference to FIGS. 1 to 4, taking a MOSFET semiconductor chip as an example.

Figure 1A:
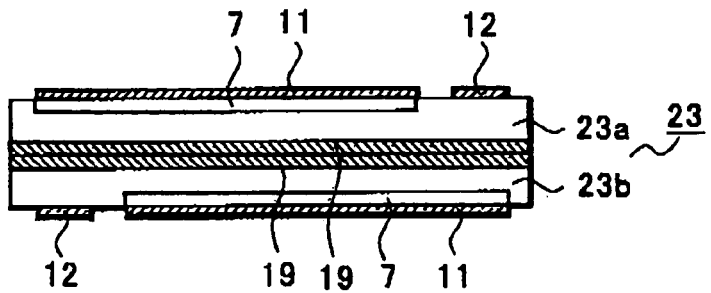
FIGS. 1A to 1C are, respectively, a side view, a plan view, and a sectional view explaining a semiconductor device according to the preferred embodiment.
Figure 1B:
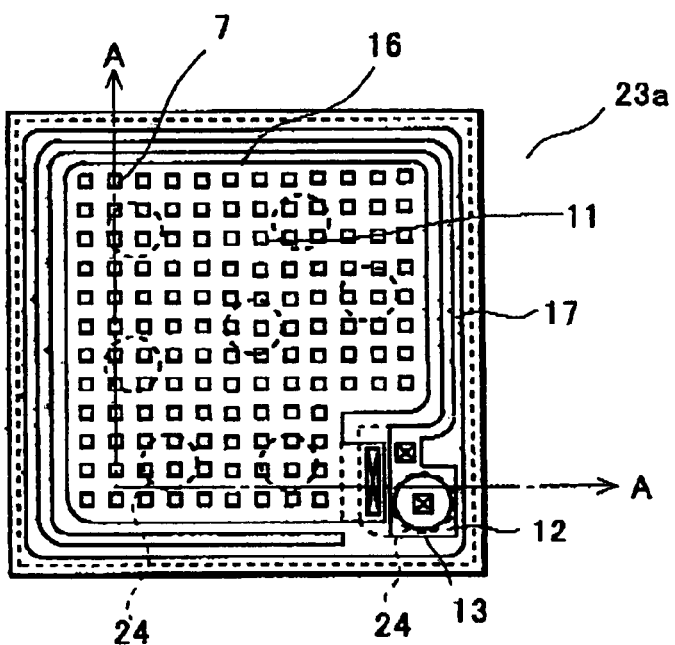
Figure 1C:
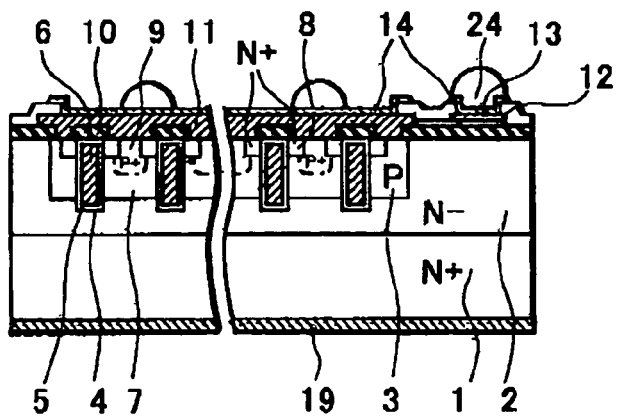

FIGS. 1A to 1C show a semiconductor element 23 of the preferred embodiment. FIG. 1A is a side view of the semiconductor element 23, FIG. 1B is a plan view of a semiconductor chip 23a, and FIG. 1C is a sectional view taken along a line A—A in FIG. 1B.

As shown in FIG. 1A, the semiconductor element 23 includes first and second semiconductor chips(MOSFET) 23a and 23b. Each of the first and second MOSFETs 23a and 23b includes a number of MOSFET cells 7 arranged on a surface of a substrate and further includes a source electrode 11 connected to the cells 7 and a gate pad electrode 12 connected to gate electrodes within the cells 7. On a back surface of each of the first and second MOSFETs 23a and 23b, a drain electrode 19 is provided. The MOSFETs 23a and 23b are superimposed on each other with the drain electrodes 19 directly connected to each other. The semiconductor element 23 is provided with connection means 24 such as solder bumps on each main surface where the cells 7 are provided, and the source electrodes 11 and gate electrodes of both the MOSFETss 23a and 23b are electrically connected to the outside through the connection means 24.

FIG. 1B shows a plan view of the first MOSFET 23a. Note that the second MOSFET 23b has the same pattern as the first MOSFET 23a, and therefore description thereof will be omitted.

A large number of the MOSFET cells 7 constituting a power MOSFET are arranged in a real operating region 16. The source electrode 11 is connected to a source region of each cell 7 in the real operating region 16. A gate connecting electrode 17 is connected to the gate electrode of each cell 7 and arranged around the real operating region 16. The source electrode 11 is connected to the connection means 24 such as solder bumps (or bonding wires) as indicated by dotted circles in the drawing. Thus, the source electrode 11 and the gate electrodes are connected to the outside. Moreover, a zener diode 13 for protection is formed under the gate pat electrode 12.

As shown in FIG. 1C, in the N-channel power MOSFET, a drain region 2 composed of an N⁻-type epitaxial layer is provided on an N⁺-type semiconductor substrate 1, and a P-type channel layer 3 is provided on the drain region 2. Trenches 4 reaching the drain region 2 are formed from a surface of the channel layer 3, and inner walls of the trenches 4 are formed gate oxide films 5. The trenches 4 are filled with polysilicon to provide gate electrodes 6. N⁺-type source regions 8 are formed in part of the surface of the channel layer 3 in adjacent to the trenches 4, and P⁺-type body regions 9 are formed in part of the surface of the channel layer 3 between two adjacent source regions 8, thus forming the individual MOSFET cells 7. The trenches 4 are covered with interlayer insulating films 10.

The source electrode 11 is provided on the real operating region 16 with the interlayer insulating films 10 interposed therebetween and contacts the source regions 8 of the MOSFET cells 7. The gate pad electrode 12 is arranged outside the real operating region 16. The gate pad electrode 12 is formed through the same process as that for the source electrode 11, and the gate electrodes 6 are extended and contact the gate pad electrode 12. The zener diode 13 for protection is provided immediately under the gate pad electrode 12. The center part of the zener diode 13 contacts the gate pad electrode 12 and the outermost periphery of the zener diode 13 is connected to the source electrode 11.

Barrier metal layers 14 of, for example, Pd/Ti or Au/TiW, are provided on the source electrode 11 and the gate pad electrode 12. The source electrode 11 and the gate electrodes 6 are led out by, for example, gold bumps 24, formed of gold plated layer, or solder bumps 24 with a height of about 25 µm on the source electrode 11 and the gate pad electrode 12, and connected to external terminals (not shown).

The drain electrode 19 is a back electrode obtained by providing a evaporated metal of gold or the like on the back surface of the first MOSFET 23a.

The two MOSFETs 23a and 23b thus formed are fixed to each other as shown in FIG. 1A. As an example of a fixing method, a wafer is diced and divided into individual semiconductor chips, and then the solder bumps 24 of one MOSFET 23b are die-bonded to the frame. Subsequently, the other MOSFET 23a is die-bonded to the exposed drain electrode 19 of the MOSFET 23b by using a solder, eutectic, or paste material or the like, thus fixing the drain electrodes 19 to each other (see FIG. 2B).

As another method, two wafers are aligned with each other by image recognition; the back electrodes (drain electrodes 19) of the respective wafers are fixed to each other by use of a solder, eutectic, or paste material or the like; the fixed wafers are divided into individual semiconductor chips. Thus, the semiconductor element 23 of FIG. 1A may be formed.

Figure 7A:
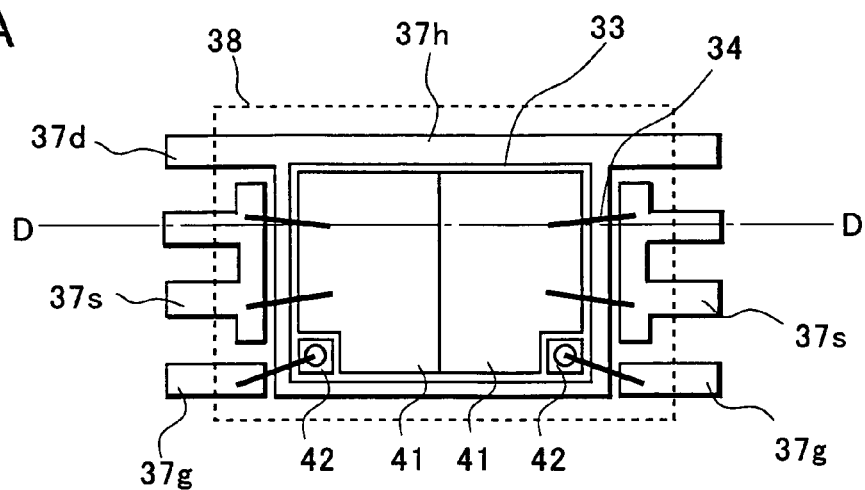
FIGS. 7A through 7C are views explaining the conventional semiconductor device.
Figure 7B:
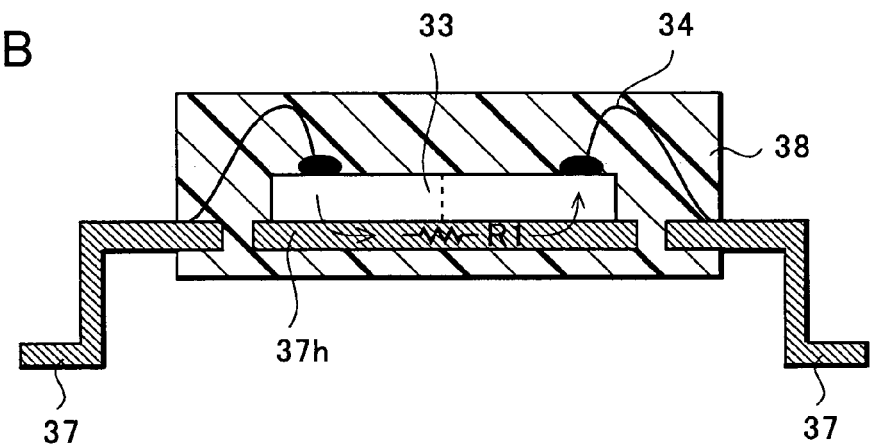
Figure 7C:
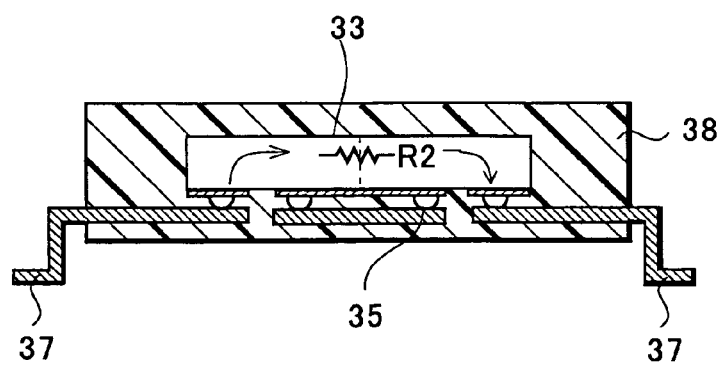

The semiconductor element 23 of this embodiment is obtained by superimposing the first and second MOSFETs 23a and 23b on each other with the drain electrodes 19 thereof directly connected to each other. The drain electrodes 19 are short-circuited by connecting the drain electrodes 19 of the two MOSFET chips to each other. In the element of which only four terminals (gate terminals and source terminals) are used, the drain terminals do not need to be exposed, and only the source electrodes 11 and the gate electrodes 6 should be led out from both the surfaces of the semiconductor element 23. In other words, it is possible to provide a dual MOSFET, which will be employed in the protection circuit shown in FIG. 5, only requiring a mounting area as large as one chip. Furthermore, connecting the drain electrodes 19 to each other will cancel the resistance component R1 of the frame (for example Cu), which has conventionally existed between the drain electrodes of a dual-MOSFET as shown in FIGS. 7A and 7B. Moreover, it is possible to reduce the resistance component R2 between the drain electrodes and to minimize the resistance between the drain electrodes.

FIGS. 2 to 4 show examples of the above-described semiconductor element 23 mounted in packages. A semiconductor device of the preferred embodiment includes the semiconductor element 23, external terminals 27, the connection means 24, and a resin layer 28.

Figure 2A:
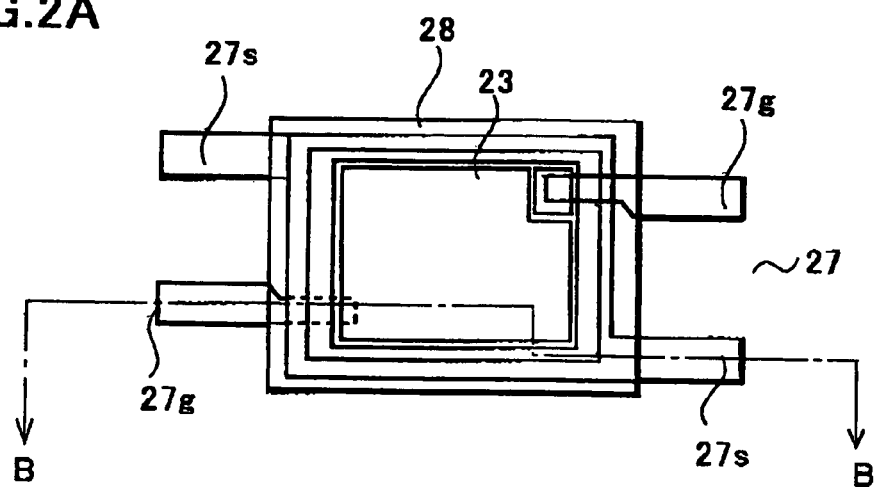
FIGS. 2A to 2C are, respectively, a plan view, a sectional view, and a sectional view explaining semiconductor devices according to the preferred embodiment.
Figure 2B:
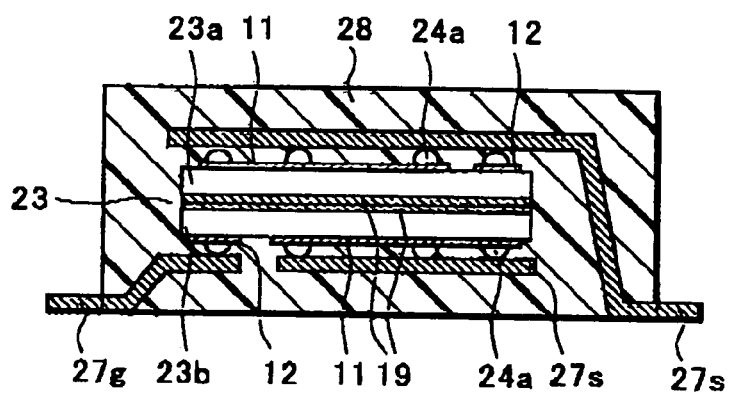
Figure 2C:
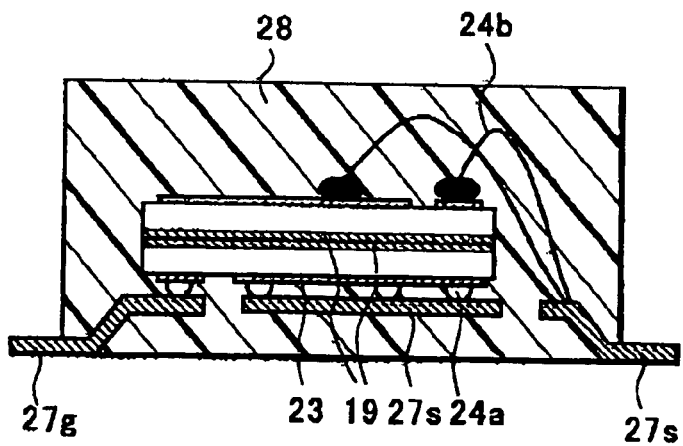

First, FIGS. 2A to 2C show the semiconductor element 23 fixed to the lead frame 27 and covered with the resin layer 28, from which the external terminals 27 are led out. FIG. 2A is a plan view. Both the MOSFETs 23a and 23b are superimposed on each other, and the leads extending leftward in the paper are connected to the source electrode and the gate pad electrode of the second MOSFET 23b on the lower side. The leads extending rightward in the paper are connected to the source electrode and the gate pad electrode of the first MOSFET 23a on the upper side.

FIG. 2B is a section taken along a line B—B in FIG. 2A. The lead frame is, for example, a stamped frame made of copper. The gate electrodes of the first and second MOSFETs 23a and 23b are connected to the leads serving as the gate terminals 27g with the solder bumps 24a interposed therebetween. The source electrodes of the first and second MOSFETs 23a and 23b are connected to the leads serving as the source terminals 27s with the solder bumps 24a interposed therebetween.

The semiconductor element 23 and the lead frame 27 are sealed with resin by transfer molding using a mold. The resin layer 28 forms a package outline. The source terminal 27s and the gate terminal 27g are led out from each MOSFET chip, thus forming a four-terminal element. The semiconductor device is mounted on a printed circuit board (not shown) with solder or the like.

In the case of the dual MOSFET, the drain electrodes 19 are short-circuited to be used and therefore are not required to be led out as the drain terminals. Accordingly, the mounting as described above becomes possible, which enables the semiconductor element to be packaged with a mounting area as large as one chip, and which therefore can contribute to reduction in size of the device.

Alternatively, as shown in FIG. 2C, the means for connecting the second MOSFET 23b and the lead frame 27 may be bonding wires 24b while the means for connecting the first MOSFET 23a and the lead frame 27 is the solder bumps 24a. Using the wires instead of the metal plate and solder bumps has advantages in terms of costs, such as availability of existing equipment. Moreover, using the wires has an advantage of allowing the degree of freedom in wiring to be easily increased.

FIGS. 3A to 3C show the semiconductor element of the preferred embodiment mounted in a chip-size package. In the chip-size package, the semiconductor element 23 is fixed on a surface of an insulating board 21. FIG. 3A is a plan view, and FIG. 3B is a sectional view taken along a line C—C in FIG. 3A.

Portions indicated by broken lines in FIG. 3A are the source terminal 27s and the gate terminal 27g leading out the electrodes of the second MOSFET 23b on the lower side. Since this package is a chip-size package, the terminals leading out the electrodes of the first MOSFET 23a on the upper side is provided on a back surface of the package.

As shown in FIG. 3B, on the surface, the insulating board 21 includes a plurality of conductive patterns 25 for the respective electrodes and further includes through holes 26 for the respective conductive patterns 25. The through holes 26 penetrate the insulating board 21, and the insides of the through holes 26 are filled with a conductive material such as tungsten. On the back surface, the insulating board 21 includes the external terminals 27 (27s, 27g), made of a conductive material, for the respective through holes 26. The source and drain electrodes of the semiconductor element 23 are connected to the corresponding conductive patterns 25 and led to the outside by the external terminals 27s and 27g.

In this case, all the conductive patterns 25 are provided in the same surface of the insulating board 21. Accordingly, for example, the second MOSFET chip is electrically connected to the external terminals 27 by use of metal plates 24c as the connection means while the solder bumps 24a are employed as the connection means of the first MOSFET chip as shown in FIG. 3B. Using the metal plates 24c as described above can reduce the resistance of the connection means compared to the case of using the bonding wires 24b.

Moreover, it is possible to use the bonding wires 24b instead of the metal plates 24c if the use thereof has no influence on the characteristics, and further it is possible to use the bonding wire 24b and the metal plate 24c together as shown in FIG. 3C. For example, the metal plate 24c is used for connecting the source electrode with a large area to the outside while the bonding wire 24b is used for the gate electrode. Since only signals should be taken out through the gate electrode, the bonding wires 24b having a small resistance and a high degree of freedom in wiring are adequate for the gate electrode in many cases.

Four side surfaces of the package are defined by cut surfaces of the resin layers 28 and the insulating board 21. An upper surface of the package is defined by a flattened surface of the resin layer 28, and a lower surface of the package is defined by a back side of the insulating board 21.

Figure 4A:
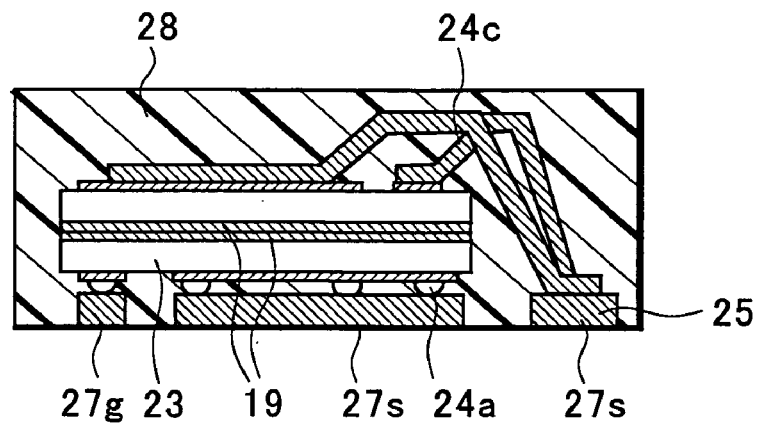
FIGS. 4A and 4B are sectional views explaining semiconductor devices according to the preferred embodiment.
Figure 4B:
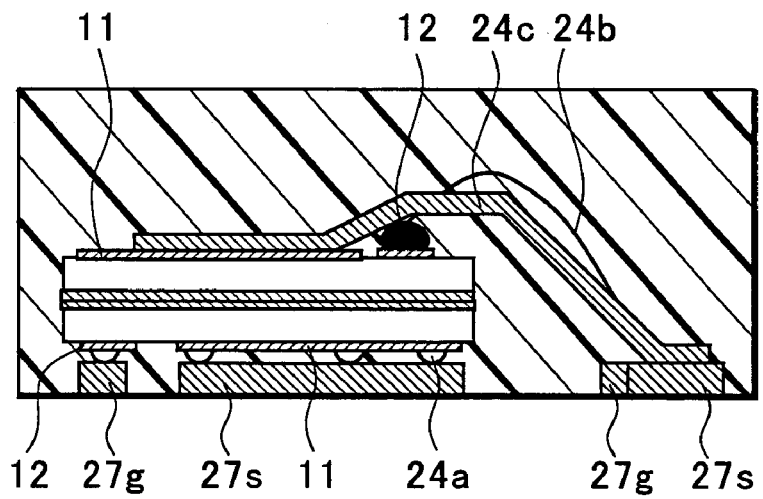

Furthermore, FIGS. 4A and 4B show a chip-size package in a multi-chip module, having a structure in which conductive patterns are buried in insulating resin to serve as a support board. A plan view thereof is the same as FIG. 3A and therefore is omitted.

The insulating resin 28 to serve as the support board fully covers the semiconductor element 23 and the plurality of conductive patterns 25 to serve as the external terminals 27. The insulating resin 28 is filled between the conductive patterns 25. The insulating resin 28 fits to a curved structure of the side surfaces of the conductive patterns 25 (the side surfaces of leads are actually curved, which is not shown in the drawing) and firmly bonds thereto. The insulating resin 28 thus supports the conductive patterns 25. The semiconductor element 23 fixed on the conductive patterns 25 is collectively covered with the insulating resin 28 and molded together. For a resin material of the insulating resin 28, it is possible to use thermosetting resin such as epoxy resin in transfer molding or thermoplastic resin such as polyimide resin or polyphenylene sulfide in injection molding.

As an example, before formed into the final structure shown in the drawing, the conductive patterns 25 are a sheet of conductive foil provided with separation grooves so that portions to serve as the external terminals 27 are protruded in the final structure. The semiconductor element 23 is fixed to this conductive foil, and the electrodes are connected to the respective conductive patterns 25. After resin sealing, the back surface of the conductive foil is chemically and/or physically removed by polishing, grinding, etching, laser evaporation of metal, or the like, thereby separating the conductive foil as the conductive patterns 25. Thus, the structure is formed in which back surfaces of the conductive patterns 25 are exposed in the back surface of the insulating resin 28. In other words, this structure is one in which the back surface of the insulating resin 28 and the back surfaces of the conductive patterns 25 form substantially the same plane.

The conductive patterns 25 are exposed as the external terminals 27 (27s, 27g). In subsequent processes (not shown), part of the back surfaces thereof is covered with resist. The resist is opened at desired positions, to which solder is supplied. This enables the semiconductor device to be self-aligned in such a manner that the semiconductor device is horizontally moved by surface tension of the solder or the like when mounted. Note that, even in this structure, the plurality of connection means can be used together as in the case of FIG. 4B.

This method is versatile because the costs are lower than those of the chip-size package shown in FIG. 3, and because the formation of the conductive patterns is easy.

Furthermore, as shown in FIGS. 3 to 4, the chip size package requires no led-out portion of the lead frame and therefore can contribute to further reduction in size of the device.

The description has been given taking as an example the clinched lead frame made of a stamped metal plate in FIGS. 2A to 2C. However, the lead frame is not limited to this and can be similarly implemented with, for example, an etching frame obtained by patterning the header and lead portions by etching. The package with the etching frame can be reduced in size and thickness compared to the package with the clinched lead frame.

In this embodiment, only some examples of combinations of package styles and the connection means have been shown. However, the preferred embodiment is not limited to the aforementioned examples and is defined only by claims.

According to the preferred embodiment, a dual MOSFET can be implemented with a chip size as large as the size of a single MOSFET and therefore can be reduced in size. Furthermore, the resistance between the drain electrodes can be reduced to a minimum by directly fixing the drain electrodes of two MOSFET chips to each other.

Specifically, it is possible to implement a semiconductor device which combines a small size and a low on-resistance, including a dual MOSFET with short-circuited drain electrodes of two MOSFET chips and with four source and gate terminals led out.

The semiconductor element 23 of the preferred embodiment is suitable for use in a protection circuit device for battery management of the charge/discharge of a lithium ion battery. That is, the semiconductor element 23 is employed as a switching element in the protection circuit device. A FET has small internal resistance in an on-state and therefore can reduce power loss and voltage loss.

Figure 5:
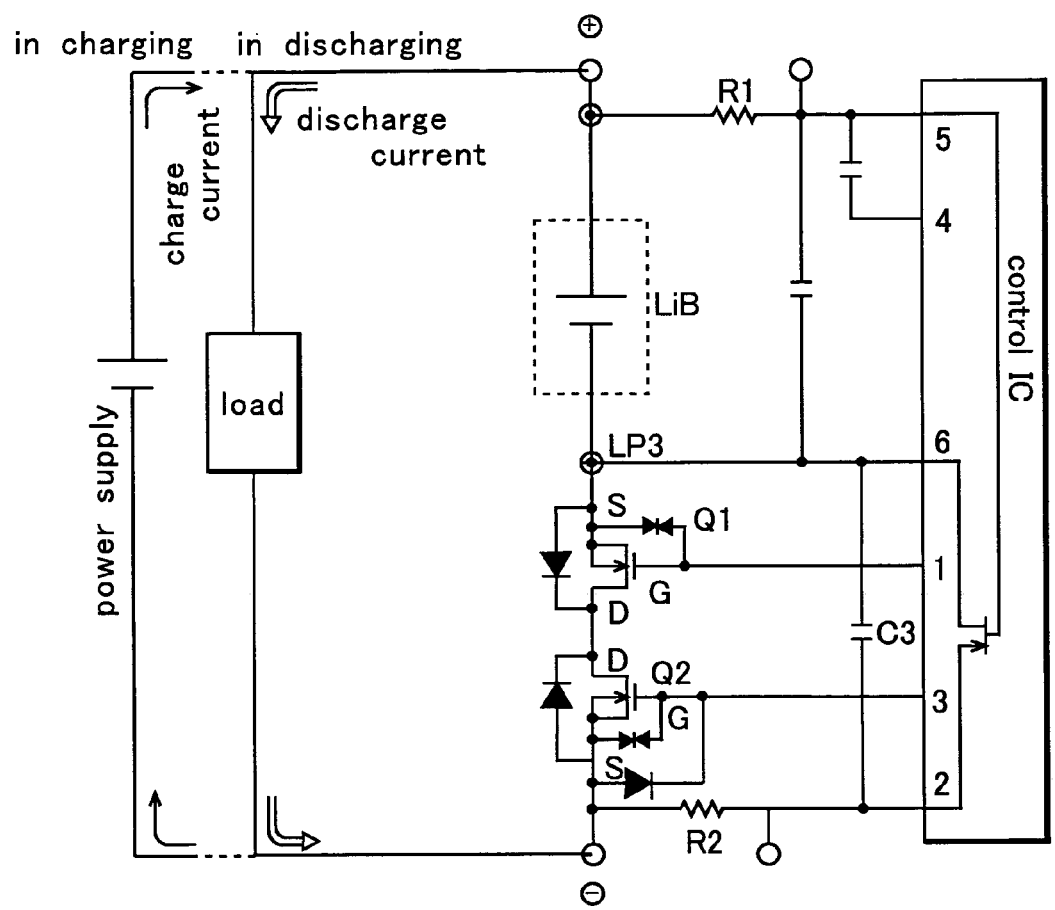
FIG. 5 is a circuit diagram explaining a protection circuit for charging/discharging a secondary battery, according to a conventional art and the preferred embodiment.
Figure 6:
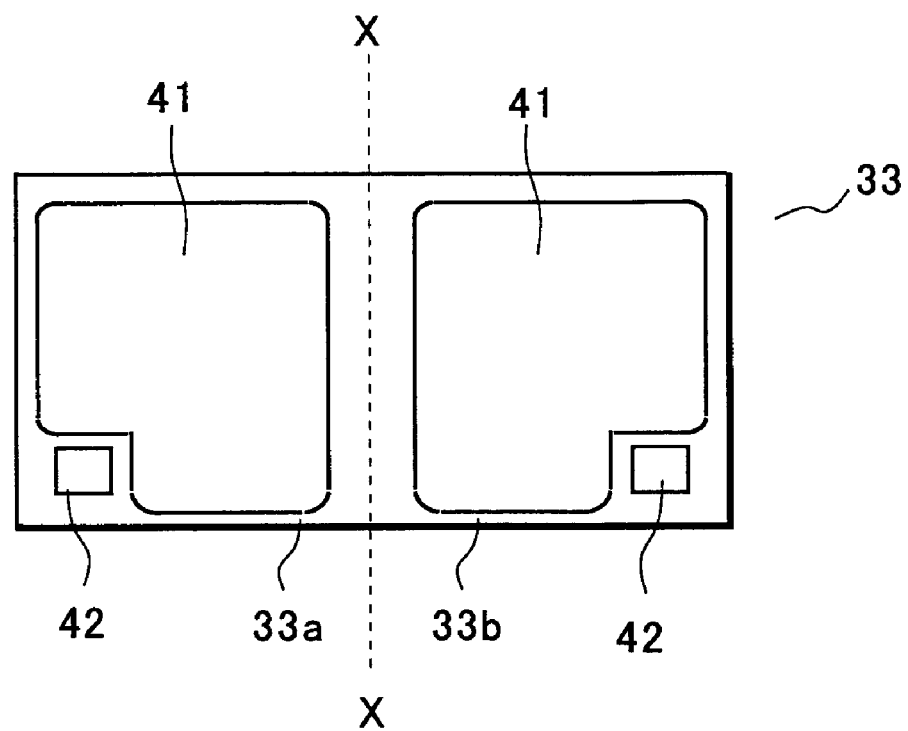
FIG. 6 is a plan view explaining a conventional semiconductor device.

A description will be given with reference to FIG. 5 once again. Although the semiconductor element 23 of the preferred embodiment has a structure in which the drain electrodes of the two MOSFETs 23a and 23b are superimposed by being directly connected to each other, the circuit thereof is similar to that concerning the connection between the MOSFETs Q1 and Q2 shown in FIG. 5. That is, the semiconductor element 23, which performs switching of a protection circuit device, is connected to a lithium ion battery in series as shown in FIG. 5.

In such a protection circuit device, the MOSFET Q1 (the first MOSFET 23a) serves as an over-discharge preventing switch, and the MOSFET Q2 (the second MOSFET 23b) serves as an over-charge preventing switch. When the voltage of the battery falls below a minimum preset voltage, the over-discharge preventing switch Q1 is switched off by the control IC, thus preventing the battery from being over-discharged. When the voltage of the battery becomes higher than a maximum preset voltage, the over-charge preventing switch Q2 is switched off by the control IC, thus preventing the battery from being over-charged.

Each of the MOSFETs 23a and 23b has a parasitic diode connected to the MOSFET 23a or 23b in parallel. Each of the parasitic diodes keeps current in an on-state, the current flowing in a counter direction concerning the MOSFET 23a (Q1) or 23b (Q2). Therefore, for example, even if the voltage of the battery becomes higher than the maximum preset voltage and the over-charge preventing switch Q2 is turned off, it is possible to discharge the battery. Conversely, even if the over-discharge preventing switch Q1 is turned off, it is possible to charge the battery.

However, in an over-discharging or over-charging state, a large current flows during a short period of time before the protection circuit works. Therefore, the peak drain current of the switching element, constituting the circuit, is required to be large.

The semiconductor element 23 of the preferred embodiment has a structure in which the drain electrodes of two MOSFETs are superimposed on each other to be directly connected to each other. Accordingly, drain resistance can be greatly reduced compared to that of a conventional one-chip dual MOSFET. That is, since the peak drain current can be further increased to be a large current, it is possible to provide suitable MOSFETs as a switching element in a protection circuit device.

What is claimed is:

1. An apparatus comprising:
a switching element including a protection circuit for battery management, the switching element including two MOSFETs having same patterns, wherein a four-terminal element is formed by directly connecting drain electrodes of the two MOSFETs to each other, and leading source and gate electrodes of the two MOSFETs to the outside; and
a battery coupled in series to the switching element.

2. An apparatus comprising:
a switching element comprising:
a pair of semiconductor chips, each including a respective drain electrode at its back surface, wherein the semiconductor chips are superimposed with their drain electrodes directly connected to one another; and
external terminals consisting only of two source terminals and two gate terminals, wherein the external terminals are coupled to surface electrodes on the semiconductor chips; and
a battery coupled in series to the switching element,
wherein, during charging of the battery, current flow is in a first direction through the series connection of the battery and the switching element, and during discharging of the battery, current flow is in a second, opposite direction.

3. The apparatus of claim 1 including a control circuit, wherein, during operation, if a voltage of the battery falls below a minimum preset value, a first one of the MOSFETs is switched off by the control circuit, and if the voltage of the battery becomes higher than a maximum preset value, a second one of the MOSFETs is switched off by the control circuit.

4. The apparatus according to claim 2, wherein the external terminals are connected to the surface electrodes by thin metal wires.

5. The apparatus according to claim 2, wherein the external terminals are connected to the surface electrodes by solder bumps.

6. The apparatus according to claim 2, wherein the external terminals are connected to the surface electrodes by metal plate.

7. The apparatus semiconductor device according to claim 2, wherein the external terminals are part of a lead frame.

8. The apparatus according to claim 2 including a resin layer covering at least the superimposed semiconductor chips, wherein the external terminals are conductive patterns buried in the resin layer, and back surfaces of the conductive patterns are exposed from the resin layer.

9. The apparatus according to claim 2, wherein the pair of superimposed semiconductor chips is fixed on a surface of an insulating board, and the surface electrodes are connected to the external terminals on a back surface of the insulating board through through-holes formed in the insulating board.

* * * * *